United States Patent [19]

Koshizuka

[11] Patent Number: 5,305,258
[45] Date of Patent: Apr. 19, 1994

[54] SEMICONDUCTOR MEMORY AND MEMORY CELL

[75] Inventor: Atsuo Koshizuka, Tokyo, Japan

[73] Assignee: Nippon Steel Corporation, Tokyo, Japan

[21] Appl. No.: 751,535

[22] Filed: Aug. 29, 1991

[30] Foreign Application Priority Data

Aug. 30, 1990 [JP] Japan .................................. 2-229766

[51] Int. Cl.$^5$ .............................................. G11C 7/02
[52] U.S. Cl. ................................ 365/189.01; 365/154; 365/190; 365/230.05
[58] Field of Search .................... 365/230.05, 154, 190, 365/202, 206

[56] References Cited

U.S. PATENT DOCUMENTS

| 4,667,310 | 5/1987 | Takada | 365/190 |
| 4,823,314 | 4/1989 | Sharp | 365/230.05 |
| 5,099,452 | 3/1992 | Yamakoshi et al. | 365/206 |

FOREIGN PATENT DOCUMENTS 142596 6/1986 Japan .................................. 365/154

Primary Examiner—Eugene R. LaRoche
Assistant Examiner—Vu A. Le
Attorney, Agent, or Firm—Pollock, Vande Sande & Priddy

[57] ABSTRACT

A semiconductor memory includes a plurality of semiconductor memory cells and a first select line for providing a first select signal to access a selected memory cell, a second select line for providing a second select signal to access a selected memory cell, the first and second select signals being independent, a first transmission line for coupling an information with the memory cell synchronizing to the first signal and a second transmission line for coupling an information with the memory cell synchronizing to the second signal. Each memory cell includes a storage element for storing an information, with at least one input-output terminal and at least one input-output section. The section includes a first input-output control element with a control electrode connected to the first select line, a first input-output electrode connected to the input-output terminal of the storage element, and a second input-output electrode connected to the first transmission line, the first control element transmitting signals between the first and the second input-output electrode when the control electrode is activated with the first select signal, and a second input-output control element with a control electrode connected to the second select line, a first input-output electrode connected to the input output terminal of the storage element, and a second input-output electrode connected to the second transmission line, the second input-output control element transmitting signals between the first and second input-output electrode when the control electrode is activated with the second select signal.

5 Claims, 2 Drawing Sheets

SEMICONDUCTOR MEMORY AND MEMORY CELL

BACKGROUND OF THE INVENTION

1. Field of the Invention

The present invention relates to a semiconductor memory such as a static random access memory (SRAM), a dynamic random access memory (DRAM), a read-only memory (ROM) and a programmable ROM (PROM), and memory cells used in the semiconductor memory.

2. Description of the Related Art

In recent years, with development of semiconductor integrating technology, implementation of large-capacity semiconductor memory (also referred to as only 'memory') has advanced. On the other hand, with increasing variety of demands, not only a memory having only read-only or random access function but also a memory having several kinds of functions (multi-functional memory) have been put into practice.

FIG. 4 shows a schematic arrangement of one memory cell in a memory having plural select lines e.g. A and B and their corresponding plural read lines e.g. A and B, which is one example of a conventional multi-functional memory.

In operation, when a select signal flowing in the select line A selects a memory cell 40, the data stored therein is read out into the read line A. On the other hand, when a select signal in the select line B selects the memory cell 40, the data stored therein is read out into the read line B.

If the memory is paired with plural systems of select lines and read lines as mentioned above, data of plural words can be read simultaneously. This contributes to realization of high speed memory access.

In the above known memory paired with plural systems of select lines and read lines, all select lines select memory cells arranged in row directions, and all read lines read the data stored in the memory cells in the selected row direction and transfer the data to the column direction, as disclosed, for example by Nagao et al. in JP-A-57-92483.

Now it is assumed that an operation of comparing the corresponding bits of word information stored in a semiconductor memory must be performed. In the conventional semiconductor memory, from which only the corresponding bits cannot be read out, the information must be read successively word by word and thereafter their corresponding bits may be compared with each other.

Utilizing the above described semiconductor memory paired with plural systems of select lines and read lines, data of plural words may be read out simultaneously, resulting in realization of a higher speed memory access. However, the stored data are also read out one word by one word even in this memory so that the above problem cannot be solved essentially.

In this way, the prior arts, which require the mentioned complicated procedures to perform the above operation, cannot realize a memory access of sufficiently high speed.

SUMMARY OF THE INVENTION

The present invention has been provided in order to solve the above problem.

An object of the present invention is to provide a semiconductor memory from which many stored data can be read word by word and also the corresponding bit data over many words can be read, and to provide memory units used in such semiconductor memories.

In order to attain the above object, in accordance with one aspect of the present invention, there are provided memory units forming an array arranged in first lines of a first or row direction and second lines of a second, or column direction which is transversel to the first direction. Each of the memory units comprises a memory cell connected with a first select line, a second select line, a first read line and a second read line, wherein the first select line transfers first select signals for selecting a first line of memory cells of the first direction, the second select line transfers second select signals for selecting a second line of the cells in the direction, the first read line transfers the second data read from the cell to the second direction when the cell is selected by the first select signal, and the second read line transfers the data read from the cell to the first direction when the cell is selected by the second select signal.

In accordance with another aspect of the present invention, there is provided a semiconductor memory comprising a plurality of memory cells arranged in an array having rows and columns, a group of first select lines for transferring first select signals selecting a row of the cells, a group of second select lines for transferring second select signals selecting a column of the cells, a group of first read lines for transferring data read from the cells of the selected row by the first select signal to the second direction, and a group of second read lines for transferring data read from the cells of the selected column by the second select signal to the first direction.

The memory cell according to the present invention constructed as described above has an arrangement of memory cells so that data are selectively read in both row and column direction.

In the semiconductor memory according to the present invention constructed as described above, when the memory cells aligned in a row constitute one word, bit data of the same bit location of many words may be read by one operation, same as for word data, from the memory cells aligned in a column direction which store bit data of the words transversally. Therefore, in the operation of comparing the corresponding bit data in a large number of words, the read operation has only to be performed once, thereby permitting high speed operation.

DESCRIPTION OF THE PREFERRED EMBODIMENTS

Figure 1:
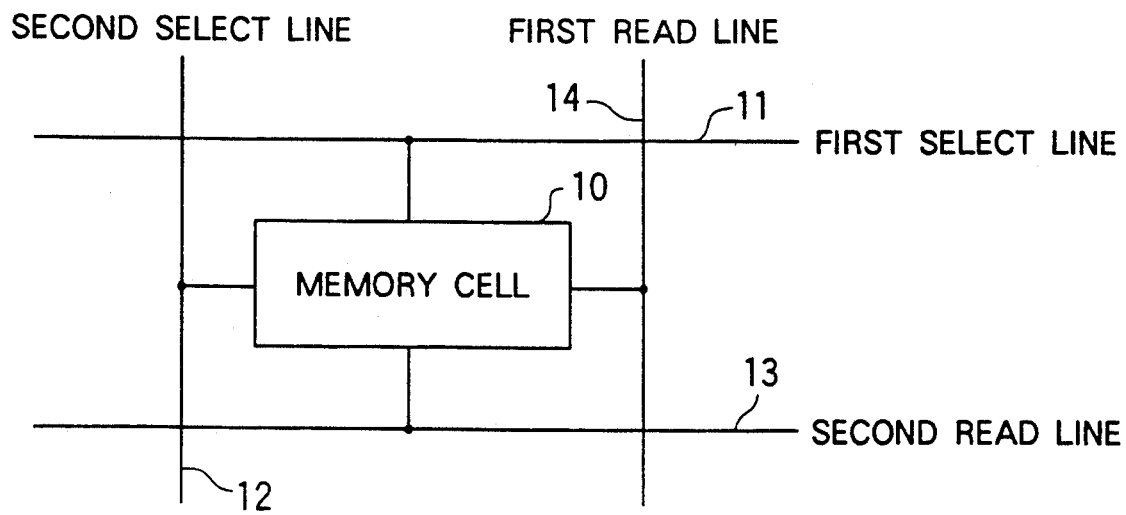
FIG. 1 is a schematic diagram showing one of a large number of memory cells arranged in a matrix shape according to the present invention, together with select lines and read lines connected with the memory cell.

Now referring to the drawings, preferred embodiments of the present invention will be explained.

Figure 2:
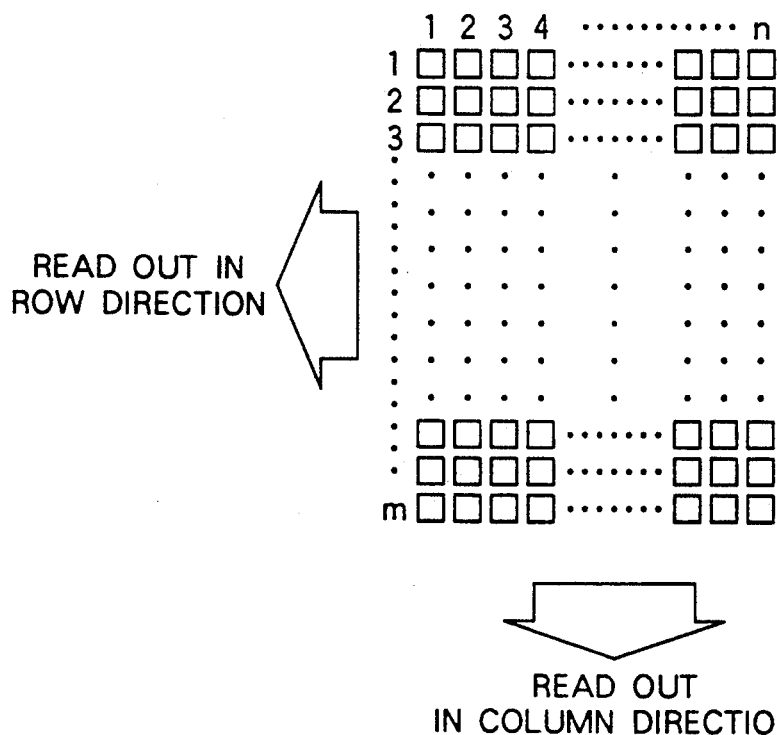
FIG. 2 is a schematic diagram of a semiconductor memory according to the present invention in which a large number of memory cells are arranged in a matrix shape.

FIG. 2 schematically shows the state where a large number of memory cells are arranged in a matrix shape in a semiconductor memory.

As seen from the figure, n×m memory cells are arranged in m rows and n columns. In this case, n is set for 16, and the memory cells aligned in a row direction correspond to one word of 16 bits. Further, m is set for e.g. 256, and the memory cells aligned in a column direction constitute the corresponding bit memories over m words.

The semiconductor memory according to this embodiment is constituted in such a manner that the data stored in 16 memory cells aligned in a selected row can be read for each location in column direction, and the data stored in 256 memory cells aligned in a selected column can be read for each location in row direction.

FIG. 1 schematically shows one of a large number of memory cells arranged in a matrix shape as shown in FIG. 2, together with a select line and a read line connected with the memory cell.

As seen from FIG. 1, a memory cell 10 is connected with two select lines including a first select line 11 extending in a row direction and a second select line 12 extending in a column direction. The memory cell 10 is also connected with two read lines including a first read line 14 extending in the column direction and a second read line 13 extending in the row direction. It should be noted that the first select line 11 is connected with n memory cells including the memory cell 10 aligned in the row direction. When a certain first or row select signal is applied to the first select line 11, the bit datum stored in the memory cell 10 appears on the first read line 14. Also, the bit data stored in the n memory cells including the memory cell 10 aligned in the row direction appear on a group of n first read lines including the first read line 14 extending to the column direction.

When a certain second or column select signal is applied to the second select line 12, the bit data stored in the m memory cells including the memory cell 10 aligned in the column direction appear on a group of m second read lines including the second read line 13 extending to the row direction. Additionally, if the memory cells at issue enable to write in, the read line 13 in the row direction and the read line 14 in the column direction can be also used as write lines.

Figure 3:
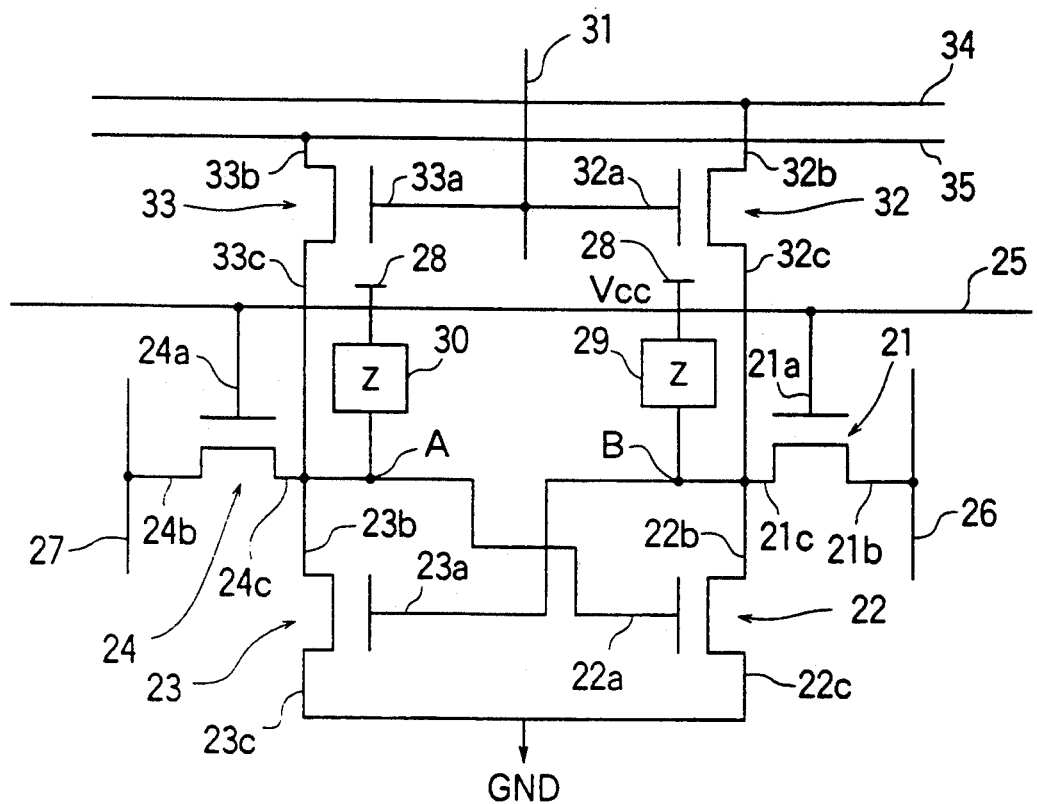
FIG. 3 is a circuit diagram of a memory cell according to the present invention in an SRAM constructed to be able to read data in both row and column directions.
Figure 4:
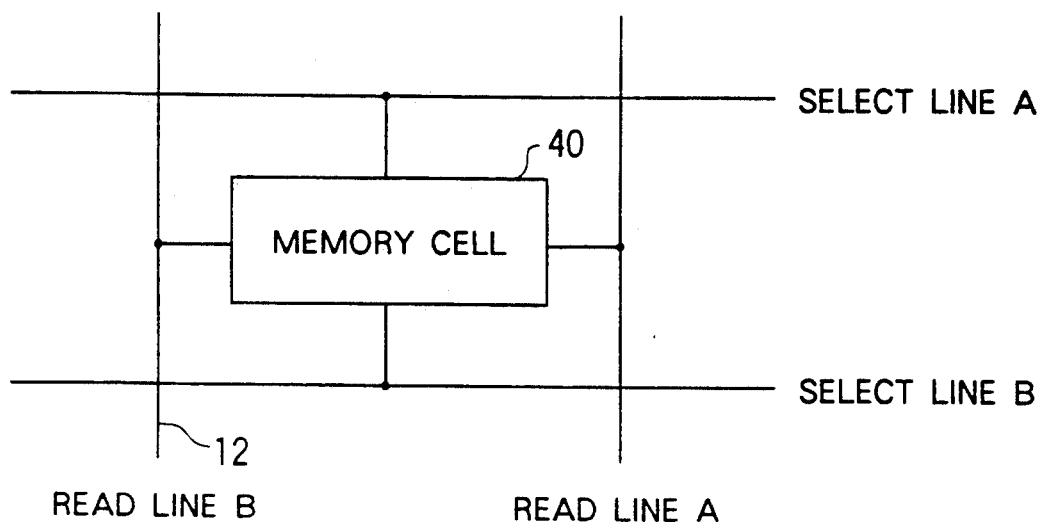
FIG. 4 is a schematic diagram of one memory cell of the prior art memory provided with plural select lines and plural read lines.

FIG. 3 is a circuit diagram in the SRAM constructed so that data can be read in both row and column directions according to one embodiment of the present invention. Incidentally, it should be noted that all of transistors 21, 22, 23, 24, 32 and 33 are N-channel type MOS transistors.

As seen from FIG. 3, like the prior art, the gate 21a of the first transistor 21 and the gate 24a of the fourth transistor 24 are connected with the first select line 25, and the respective drains 21b and 24b of these first and fourth transistors 21 and 24 are connected with the first read lines 26 and 27 (also serving as write lines), respectively. The source 21c of the first transistor 21 is connected with the drain 22b of the second transistor 22 and the gate 23a of the third transistor 23, while the source 24c of the fourth transistor 24 is connected with the drain 23b of the third transistor 23 and the gate 22a of the second transistor 22. The respective sources 22c and 23c of the second and third transistors 22 and 23 are connected to ground.

Further, the first impedance element 29 is connected between a power source 28 and the drain 22b of the second transistor 22, and the second impedance element 30 is connected between the power source 28 and the drain 23b of the third transistor 23.

The memory cell according to this embodiment is further provided with the second select line 31 extending in the column direction and the second read lines 34 and 35 (also serving as write lines) extending in the row direction. The second select line 31 is connected with the gate 32a of the fifth transistor 32 and the gate 33a of the sixth transistor 33, while the second read lines 34 and 35 are connected with the drain 32b of the fifth transistor 32 and the drain 33b of the sixth transistor 33. The source 32c of the fifth transistor 32 is connected with the drain 22b of the second transistor 22, and the source 33c of the sixth transistor 33 is connected with the drain 23b of the third transistor 23.

An explanation will be given of the write operation of the memory cell of SRAM constructed as described above. It should be noted that bit information is to be simultaneously written in the memory cells aligned in the row direction, that is n memory cells aligned in a horizontal direction in FIG. 2. First, by boosting the potential of the first select line 25 to an H level, the memory cell shown in FIG. 3 together with all the memory cells aligned in the same line of the row direction is selected. The voltage of one of the first read or write lines 26 and 27 is set for an H level and that of the other thereof is set for an L level so that the bit information will be written into the memory cell at issue. Now it is assumed that the read or write line 26 is at the L level and the read or write line 27 is at the H level. The first select line 25 has been boosted to the H level so that the first and fourth transistors 21 and 24 turn on, and thus the source (point A) of the fourth transistor 24 is boosted to the H level. When the point A has been boosted to the H level, the second transistor 22 turns on. Then, the source (point B) of the first transistor 21 is grounded through the second transistor so that the point B is lowered to the L level. Thus, the transistor 23 turns off. Now, if the first select line 25 is returned to the L level, the first and fourth transistors 21 and 24 turn off so that the point A is maintained at the H level and the point B at the L level.

Additionally, the memory state, that is one of the points A and B is at the H level and the other is at the L level, may change with passage of time due to the leak current from each transistor. In order to prevent the change, the first and second impedance elements 29 and 30 of high impedance, which is as high as several tera ohms, serve to supply a current by the leak current from each transistor.

Further, in contrast to the above explanation, the state where the point A is at the L level and the point B is at the H level can be provided by the write operation with the read or write line 26 at the H level and the other read or write line 27 at the L level.

In addition to the above described simultaneous write operation of n respective items of bit information in the n memory cells aligned in the row direction or the horizontal direction in FIG. 2, m respective items of bit information can be simultaneously written in the m memory cells aligned in the column direction or the vertical direction in FIG. 2. In this case, the second select line 31 and the second read or write lines 34 and 35, instead of the first select line 25, and the first read or write lines 26 and 27 in the above explanation, can be controlled to write the H level signal in the one of the points A and B and the L level signal in the other thereof.

An explanation will be given of the operation of reading the bit information stored in the memory cells. Now it is assumed that with the point A at the H level and the point B at the L level, the respective items of bit information are to be simultaneously read from the m memory cells aligned in the column direction or the vertical direction in FIG. 2. In this case, first, the second select line 31 is set for the H level so that the memory cells of FIG. 3 and all the memory cells aligned in the same column including the memory cell at issue are selected. Thus, with respect to the memory cell shown in FIG. 3, the fifth and sixth transistors 32 and 33 turn on so that the memory state where the point A is at the H level and the point B at the L level is read through the second read lines 34 and 35 extending in the row direction. The transversed memory state where the point A is at the L level and the point B at H level can also be read in the similar manner.

In accordance with this embodiment, the memory cell is provided with the first select line 25 extending in the row direction and the second select line 31 extending in the column direction, and the first read lines 26 and 27 extending in the column direction and the second read lines 34 and 35 extending in the row direction so that the data can be read one word by one word, and also bit data at arbitrary positions over a large number of words, e.g. the most significant bits of the respective words, can be read at a time.

Although the above embodiment is directed to the memory cell of SRAM as shown in FIG. 3, the semiconductor memory according to the present invention is not limited to SRAM but can be generally applied to any semiconductor memory.

As described above, the present invention can provide memory units of a semiconductor memory which enable to read out word by word and also bit data at any predetermined bit of the respective words.

Further, the semiconductor memory according to the present invention is provided with a group of first select lines and a group of first read lines for reading data from the memory cells aligned in the row direction and also a group of second select lines and a group of second read lines so that a large number of data can be read also in the column direction. Thus, the present invention can provide a semiconductor memory which can perform at high speed the operation of comparing the corresponding bits of a large number of words.

I claim:

1. A semiconductor memory including a plurality of semiconductor memory cells and comprising:
    a first select line for providing a first select signal to access a selected memory cell;
    a second select line for providing a second select signal to access a selected memory cell, said second select signal being independent from said first select signal;
    a first transmission line for coupling an information with the memory cell synchronizing to said first select signal;
    a second transmission line for coupling an information with the memory cell synchronizing to said second select signal; and
    each memory cell of said plurality of semiconductor memory cells including:
        a storage element for storing an information, having at least one input-output terminal;
        at least one input-output section including:
        a first input-output control element having a control electrode connected to said first select line, a first input-output electrode connected to said input-output terminal of the storage element, and a second input-output electrode connected to said first transmission line, said first input-output control element transmitting signals between said first input-output electrode and said second input-output electrode when said control electrode is activated with said first selected signal; and
        a second input-output control element having a control electrode connected to said second select line, a first input-output electrode connected to said input-output terminal of the storage element, and a second input-output electrode connected to said second transmission line, said second input-output control element transmitting signals between said first input-output electrode and said second input-output electrode when said control electrode is activated with said second select signal;
    said storage element being formed of a flip-flop circuit having a first input-output terminal and a second input-output terminal, said second input-output terminal bearing a complementary signal to a signal borne by said first input-output terminal;
    said first transmission line comprising a first conductor for carrying a first signal and a second conductor for carrying a second signal complementary to the first signal;
    said second transmission line comprising a third conductor for carrying a third signal and a fourth conductor for carrying a fourth signal complementary to the third signal; and
    said semiconductor memory cell comprising two of said input-output sections including a first input-output section and a second input-output section;
    wherein said first input-output section is connected to said first input-output terminal of said flip-flop circuit with said first input-output electrodes, to said first conductor with said second input-output electrode of said first input-output control element, and to said third conductor with said second input-output electrode of said second input-output control element; and
    wherein said second input-output section is connected to said second input-output terminal of said flip-flop circuit with said first input-output electrodes, to said second conductor with said second input-output electrode of said first input-output control element, and to said fourth conductor with said second input-output electrode of said second input-output control element, respectively.

2. The semiconductor memory according to claim 1, wherein each of said first and second input-output control elements comprises an input-output transistor having a gate connected to said control electrode, a source connected to any one of said first and second input-output electrodes, and a drain connected to another one of said first and second input-output electrodes.

3. A semiconductor memory including a plurality of semiconductor memory cells and comprising:
    a first select line for providing a first select signal to access a selected memory cell;

a second select line for providing a second select signal to access a selected memory cell, said second select signal being independent from said first select signal;

a first transmission line for coupling an information with the memory cell synchronizing to said first select signal;

a second transmission line for coupling an information with the memory cell synchronizing to said second select signal; and each memory cell of said plurality of semiconductor memory cells including:

a storage element for storing an information, having at least one input-output terminal;

at least one input-output section including:

a first input-output control element having a control electrode connected to said first select line, a first input-output electrode connected to said input-output terminal of the storage element, and a second input-output electrode connected to said first transmission line, said first input-output control element transmitting signals between said first input-output electrode and said second input-output electrode when said control electrode is activated with said first select signal; and a second input-output control element having a control electrode connected to said second select line, a first input-output electrode connected to said input-output terminal of the storage element, and a second input-output electrode connected to said second transmission line, said second input-output control element transmitting signals between said first input-output electrode and said second input-output electrode when said control electrode is activated with said second select signal;

said storage element being formed of a flip-flop circuit having a first input-output terminal and a second input-output terminal, said second input-output terminal bearing a complementary signal to a signal borne by said first input-output terminal;

wherein said plurality of memory cells are arranged in an array having a first direction and a second direction, said second direction being substantially perpendicular to said first direction; and wherein a plurality of said first select lines extend in said first direction, each of said first select lines being connected with memory cells arranged in the corresponding first direction;

a plurality of said second transmission lines comprising said third and fourth conductors extend in said first direction, each of said second transmission lines being connected with memory cells arranged in the corresponding first direction;

a plurality of said second select lines extend in said second direction, each of said second select lines being connected with memory cells arranged in the corresponding second direction; and a plurality of said first transmission lines comprising said first and second conductors extend in said second direction, each of said first transmission lines being connected with memory cells arranged in the corresponding second direction.

4. The semiconductor memory according to claim 3, wherein the memory cells arranged in said first direction are successively read out onto one of said third and fourth conductors of said second transmission line when said memory cells are accessed in response to said first select signal provided through a corresponding first select line, and the memory cells arranged in said second direction are successively read out onto one of said first and second conductors of said first transmission line when said memory cells are accessed in response to said second select signal provided through a corresponding second select line.

5. The semiconductor memory according to claim 3, wherein the memory cells arranged in said first direction are successively written with information provided from said second transmission line when said memory cells are accessed in response to said first select signal provided through a corresponding first select line, and the memory cells arranged in said second direction are successively written with information provided from said first transmission line when said memory cells are accessed in response to said second select signal provided through a corresponding second select line.

* * * * *